United States Patent [19]

Enomoto et al.

[11] Patent Number: 5,284,411
[45] Date of Patent: Feb. 8, 1994

[54] CONVEYOR FOR CONVEYING WORKPIECES IN A VACUUM CHAMBER

[75] Inventors: Yoshihiro Enomoto; Yoshimasa Oda, both of Narashino, Japan

[73] Assignee: Seiko Seiki Kabushiki Kaisha, Japan

[21] Appl. No.: 851,835

[22] Filed: Mar. 16, 1992

[30] Foreign Application Priority Data

Mar. 18, 1991 [JP] Japan .................. 3-52687

[51] Int. Cl.⁵ .................................. B65G 49/00
[52] U.S. Cl. .......................... 414/217; 198/619
[58] Field of Search ............. 198/619, 805; 414/217

[56] References Cited

U.S. PATENT DOCUMENTS

| | | | |
|---|---|---|---|
| 3,616,978 | 11/1971 | Haslam | 198/619 X |
| 4,462,529 | 7/1984 | Ladouceur | 198/619 X |
| 4,768,438 | 9/1988 | Hughes | 198/619 X |
| 5,069,326 | 12/1991 | Sakamoto et al. | 198/619 |
| 5,105,932 | 4/1992 | Bryson, III et al. | 198/619 |

Primary Examiner—D. Glenn Dayoan
Attorney, Agent, or Firm—Bruce L. Adams; Van C. Wilks

[57] ABSTRACT

A conveyor for conveying a workpiece in a vacuum chamber includes a floating body having a conveying rod, a pair of magnetic bearing portions disposed in a moving direction of the floating body and supporting the floating body solely by magnetic forces, and a non-contact driving motor portion for directly reciprocating the floating body. The floating body is directly reciprocated by a linear pulse motor. The linear pulse motor comprises a motor main body and a cog portion, and the motor main body is interposed between a pair of magnetic bearing portions. The cog portion is disposed in a longitudinal or axial direction of the outer peripheral surface of the floating body and coacts with the motor main body to reciprocate the floating body.

13 Claims, 3 Drawing Sheets

CONVEYOR FOR CONVEYING WORKPIECES IN A VACUUM CHAMBER

BACKGROUND OF THE INVENTION

1. Field of the Invention

This invention relates to a conveyor for conveying workpieces such as semiconductor wafers existing inside a vacuum chamber.

2. Description of the Prior Art

A conventional conveyor of this kind has a cylindrical separator wall 1 as shown in FIG. 5, and one of the ends of this separator wall 1 is open to the inside of a vacuum chamber 2 with the other end being closed by a cover 3.

A floating body 5 having a conveying rod 4 is disposed at the inner peripheral portion of the separator wall 1, and a driving unit 6 is fitted movably to the outer peripheral portion of the separator wall 1. The driving unit 6 is so constituted as to be capable of reciprocating along the outer peripheral portion of the separator wall 1 by a ball screw mechanism 8 disposed on a base 7.

Two sets of magnetic bearing portions 9, 9 are disposed inside the driving unit 6. Each of the magnetic bearing portions 9, 9 includes a plurality of electromagnets 10, 10 and a sensor portion not shown in the drawing. The sensor portion detects the floating position of the floating body 5. Each of the electromagnets 10 is excited on the basis of the detected value outputted from the sensor portion, and is constituted so that its magnetic force acts on the floating body 5 through the separator wall 1. In this way, each magnetic bearing portion 9, 9 supports the floating body 5 like a two-point support beam by magnetism.

In the conveyor described above, the floating body 5 is in advance supported by each magnetic bearing portion 9, 9, and the ball screw mechanism 8 is then driven so as to reciprocate the driving portion 6 along the outer periphery of the separator wall 1. The floating body 5 reciprocates in such a manner as to follow the reciprocation of the driving portion. Accordingly, the conveying rod 4 of the floating body 5 is constituted so as to convey a wafer W.

However, while the transfer of the wafer W by the conveying rod 4 described above can be attained by merely reciprocating the floating body 5, the conventional conveyor must drive the driving portion 6 when the floating body 5 reciprocates. Therefore, the size of the apparatus becomes greater by the moving space required for the driving portion 6 and by the installation space required for the ball screw mechanism 8 for moving the driving portion. Moreover, since the conventional ball screw mechanism 8 generates dust, the separator wall 1 is necessary and hence, the size of the apparatus becomes even greater.

SUMMARY OF THE INVENTION

It is an object of the present invention to provide a compact conveyor with a dust free structure. To accomplish this object, the conveyor of the present invention is characterized by including a floating body having a conveying rod, a pair of magnetic bearing portions disposed in a moving direction of the floating body and supporting the floating body by magnetic force, and a non-contact driving motor portion for directly reciprocating the floating body.

According to the present invention, the pair of magnetic bearing portions support the floating body by magnetic force and the non-contact driving portion directly reciprocates the floating body. Therefore, only the floating body reciprocates.

DETAILED DESCRIPTION OF THE PREFERRED EMBODIMENT

Hereinafter, an embodiment of the conveyor of the present invention will be explained in detail with reference to the drawings.

Figure 1:
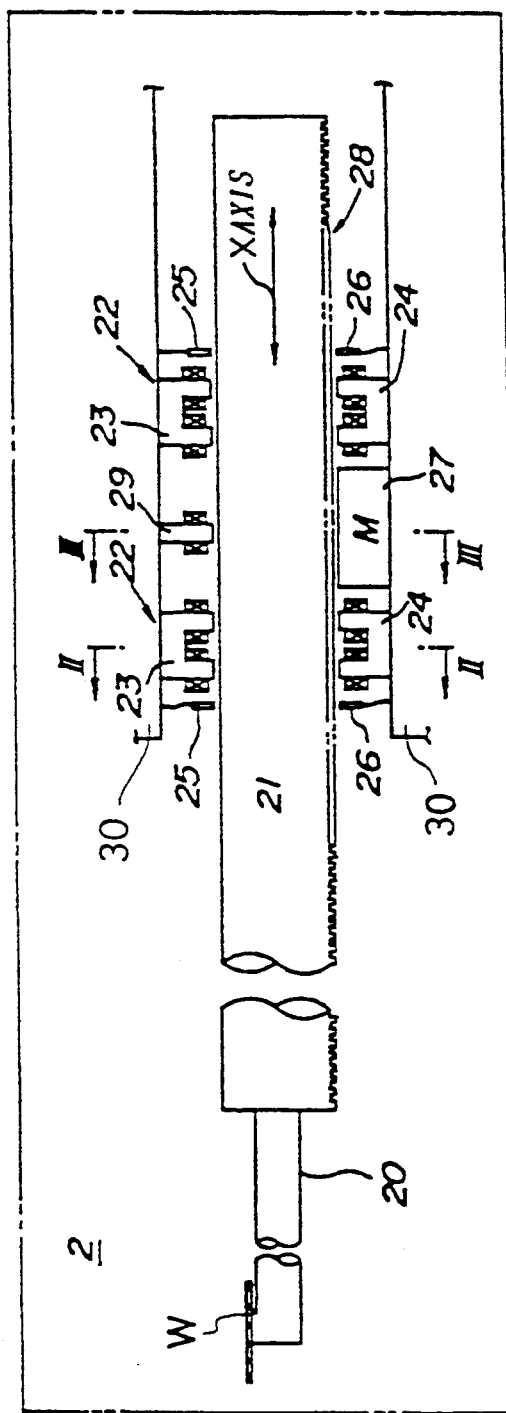
FIG. 1 is a sectional view for explaining the principal portions of a conveyor according to the present invention.

As shown in FIG. 1, a floating body 21 has a conveying rod 20 inside a vacuum chamber 2, and a pair of magnetic bearing portions 22, 22 on the outer peripheral side of the floating body 21. These magnetic bearing portions 22, 22 are disposed in an axial direction (X-axis) of the floating body 21.

Figure 2:
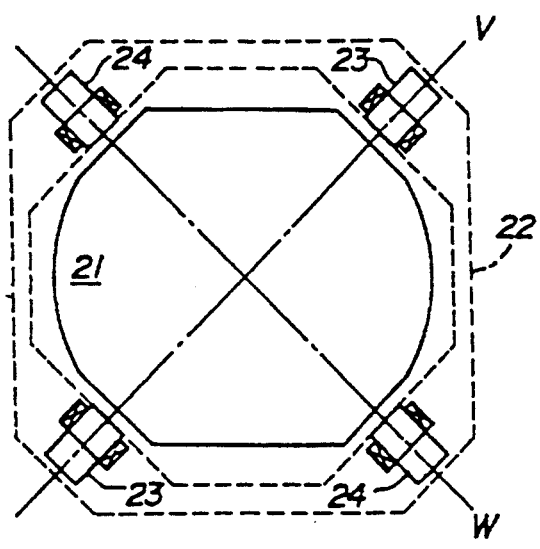
FIG. 2 is a sectional view taken along a line II—II of FIG. 1.

Each of the magnetic bearing portions 22, 22 has two electromagnets 23, 23 on a V-axis and two electromagnets 24, 24 on a W-axis as shown in FIG. 2. The electromagnets 23, 23 are disposed so as to face the outer peripheral surface of the floating body 21 and to oppose each other through the floating body 21. Similarly, the electromagnets 24, 24, are also disposed so as to face the outer peripheral surface of the floating body 21 and to oppose each other through the floating body 21. The electromagnets 23,23 and 24,24 magnetically support the floating body 21 in a radial direction, i.e., along the V-axis and W-axis shown in FIG. 2.

A sensor 25, 26 is disposed for each magnetic bearing portion 22, 22. The sensor 25 is constituted so as to detect the floating position of the floating body 21 on the V-axis, and the sensor 26 is so constituted as to detect the floating position of the floating body 21 on the W-axis.

Each electromagnet 23, 24 of each magnetic bearing portion 22, 22 is excited on the basis of the detected value outputted from the sensor 25, 26 and its magnetic force directly acts on the floating body 21. In this way, each magnetic bearing portion 22, 22 magnetically supports the floating body 21 by the magnetic force like a two-point support beam.

Figure 3:
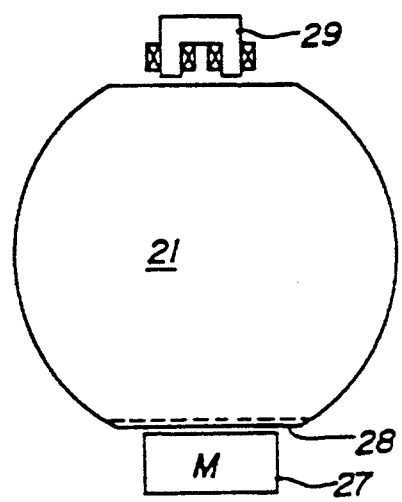
FIG. 3 is a sectional view taken along a line III—III of FIG. 1.

To reciprocate the floating body 21 in the axial direction, this conveyor is provided with a linear pulse motor as a non-contact driving motor portion, and this linear pulse motor comprises a motor main body 27 for generating a magnetic field and a cog portion 28. The motor main body 27 carried by the floating body 21 and responsive to the magnetic field to magnetically drive the floating body in the axial direction is interposed between the pair of magnetic bearing portions 22 and 22, and the cog portion 28 is disposed in the longitudinal or axial direction of the outer peripheral surface of the floating body 21 and has a row of magnetic teeth which face the motor main body 27 as shown in FIG. 3. Since the motor is a linear pulse motor, the motor main body 27 never contacts the cog portion 28. The motor main body 27 includes electromagnets for generating a linear traveling magnetic field to magnetically attract the cog portion 28 in order to directly reciprocate the floating body.

An electromagnet 29 is disposed so as to face the outer peripheral surface of the floating body 21 and to energize the roll operation of the floating body 21 by its magnetic force. A stator 30 supports each electromagnet, the sensor portions and the motor main body.

Figure 5:
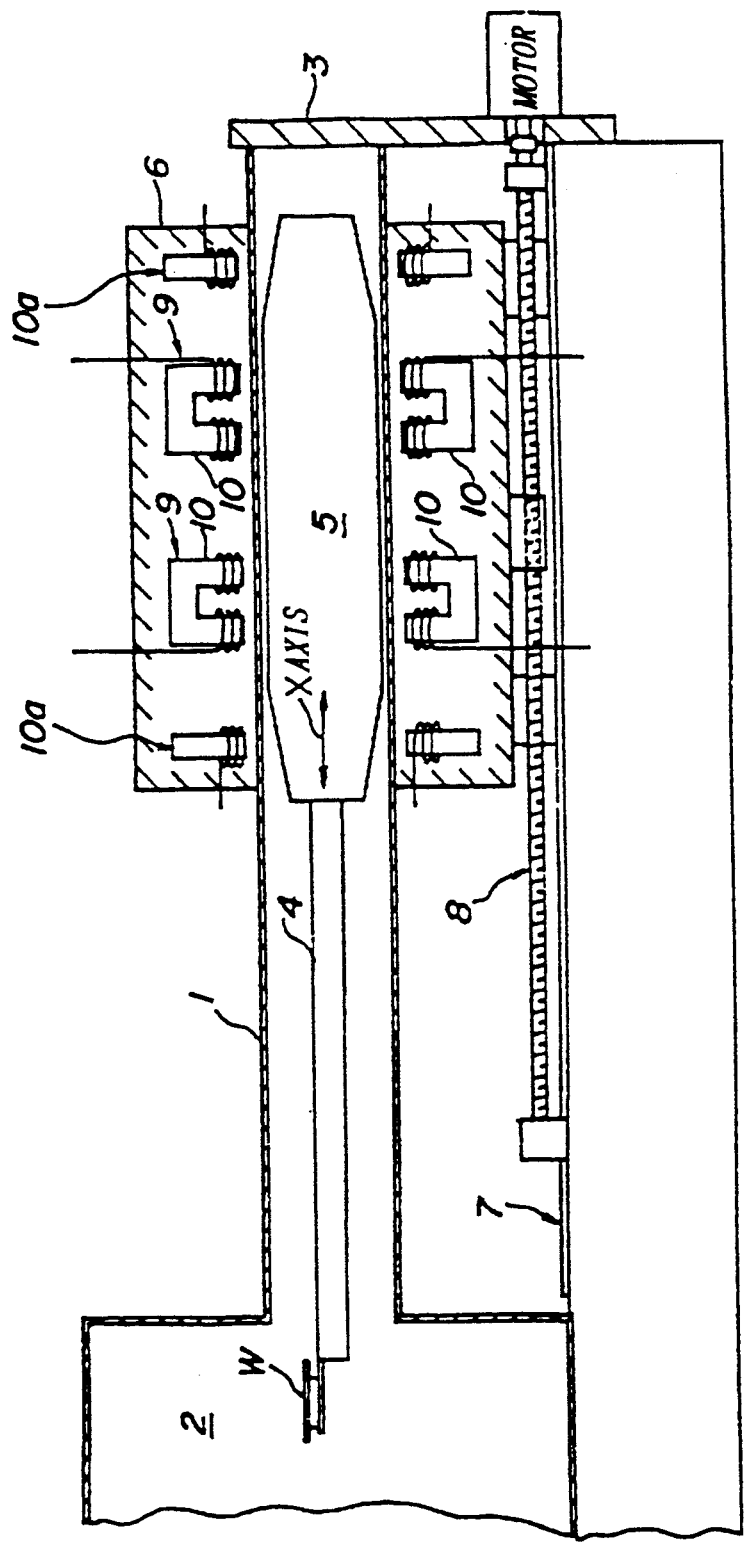
FIG. 5 is a sectional view explaining a conventional conveyor.

In order to keep the position of the floating body 21 on the X-axis as shown in FIG. 1, the conveyor of this invention may also be provided with axial electromagnets 10a, 10a(see FIG. 5) in the same way as in the prior art. However, these axial electromagnets 10a, 10a are omitted in the present apparatus because the position retaining force of the linear pulse motor in this apparatus is excellent.

Next, the operation of the conveyor constituted as described above will be explained with reference to FIG. 1. According to this conveyor, the floating body 21 is in advance magnetically supported in the radial direction by the magnetic bearing portions 22, 22 and then the motor main body 27 of the linear pulse motor is driven so that the motor main body 27 can directly reciprocate only the floating body 21. In this way, the conveying rod 20 of the floating body 21 conveys the wafer W.

Figure 4:
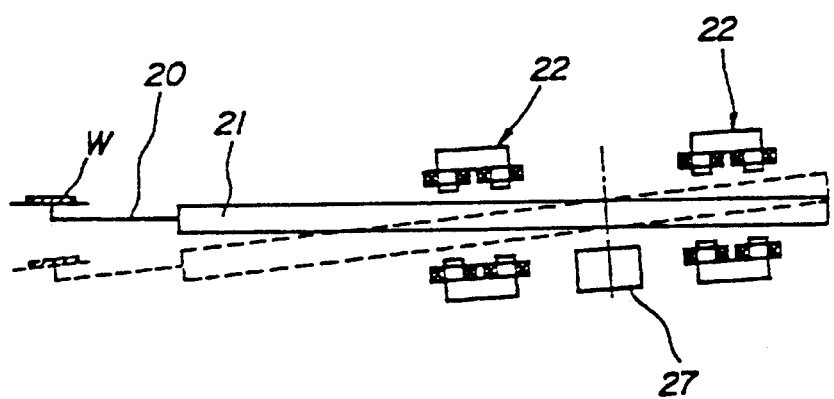
FIG. 4 is an explanatory view of the operation of the inventive conveyor.

In practice, this apparatus may be required to move the wafer W up and down, i.e., in a transverse or radial direction. In such a case, the conveying rod 20 operates like a seesaw when the excitation current of the magnetic bearing portion 22 is regulated with the center axis of the motor main body 27 of the linear pulse motor being the support point, as shown in FIG. 4.

Therefore, according to the embodiment described above, the motor main body of the linear pulse motor directly reciprocates the floating body and only the floating body moves. Accordingly, the apparatus becomes compact in size.

Moreover, since the conveyor described above does not generate any dust, the separator wall, etc, found in the convention conveyor for preventing dust need not be disposed. Therefore, the apparatus becomes further reduced in size.

Though this embodiment uses a linear pulse motor, a non-contact driving motor such as a voice coil motor, etc, can be used in place of the linear pulse motor.

Since the conveyor according to the present invention is constituted in such a manner that the non-contact driving motor portion directly reciprocates the floating body and only the floating body moves, there can be provided a compact apparatus.

Moreover, since this apparatus does not generate dust, the separator wall, found in the conventional conveyor apparatus for preventing dust need not be disposed. For this reason, the apparatus becomes further reduced in size.

What is claimed is:

1. A conveyor for conveying a workpiece in a vacuum chamber, comprising:
   a floating body having a conveying rod with a workpiece supporting portion;
   a plurality of magnetic bearings disposed in axially spaced relation along an axial movement direction of said floating body for supporting said floating body in a radial direction by magnetic forces; and
   a non-contact driving motor for directly reciprocating said floating body, the driving motor having a motor main body disposed adjacent to said floating body for generating a magnetic field, and a cog portion facing said motor main body and extending along an axial direction of the outer peripheral surface of said floating body and linearly driveable by the magnetic filed generated by said motor main body.

2. A conveyor according to claim 1; wherein said non-contact driving motor reciprocates said floating body in an axial direction.

3. A conveyor according to claim 1; wherein said non-contact driving motor is disposed between said plurality of magnetic bearings.

4. A conveyor according to claim 1; wherein said plurality of magnetic bearings are positioned to control tilting movement of said floating body relative to the axial direction thereof to thereby control radial movement of the workpiece.

5. A conveyor according to claim 1; wherein said floating body, said plurality of magnetic bearings and said non-contact driving motor are all disposed inside the vacuum chamber.

6. An apparatus for conveying a workpiece, comprising:
   a floating body having a workpiece holding portion for holding a workpiece and being movable in axial and radial directions;
   stationary support means for magnetically supporting the floating body in the radial direction without physically contacting the floating body; and
   driving means for magnetically driving the floating body in the axial direction without physically contacting the floating body.

7. An apparatus according to claim 6; wherein the support means comprises a plurality of magnetic bearings disposed in axially spaced relation in the axial direction of movement of the floating body.

8. An apparatus according to claim 7; wherein the plurality of magnetic bearings are positioned to effect tilting movement of the floating body relative to the axial direction.

9. An apparatus according to claim 6; including a vacuum chamber housing therein the floating body, the support means and the driving means.

10. An apparatus according to claim 6; wherein the driving means comprises first magnetic means for creating a magnetic field, and second magnetic means connected to and extending axially along the floating body and responsive to the magnetic field to magnetically drive the floating body in the axial direction.

11. An apparatus according to claim 10; wherein the second magnetic means comprises a row of magnetic members extending axially along the floating body.

12. An apparatus according to claim 10; wherein the row of magnetic members comprises a row of teeth.

13. An apparatus according to claim 10; wherein the first magnetic means comprises a motor main body disposed adjacent to the floating body for generating the magnetic field, and the second magnetic means comprises a cog portion extending axially along the floating body in opposed facing relation to the motor main body and coacting with the magnetic field generated by the motor main body to magnetically drive the floating body.

* * * * *